United States Patent [19]

Sidner et al.

[11] Patent Number: 4,975,759
[45] Date of Patent: Dec. 4, 1990

[54] SEMICONDUCTIVE STALK STRUCTURE

[75] Inventors: Diane W. Sidner, Noblesville; Douglas J. Yoder, Sharpsville; David E. Moss, Kokomo, all of Ind.

[73] Assignee: Delco Electronics Corporation, Kokomo, Ind.

[21] Appl. No.: 318,887

[22] Filed: Mar. 6, 1989

[51] Int. Cl.$^5$ ............................................. H01L 27/12
[52] U.S. Cl. ...................................... 357/49; 357/47; 357/55; 357/56
[58] Field of Search ..................... 357/49, 55, 56, 47

[56] References Cited

U.S. PATENT DOCUMENTS 4,688,069  8/1987  Joy et al. ............................ 357/49

OTHER PUBLICATIONS

IBM Technical Disclosure Bulletin, vol. 6 #4 p. 1301 Sep. 1973 by Broadie et al.

Primary Examiner—Mark Prenty
Attorney, Agent, or Firm—Robert J. Wallace

[57] ABSTRACT

A moat having a flat bottom and tapered side walls is formed in a monocrystalline silicon body (substrate) and extends from a top surface of the substrate into the substrate. An oxide layer is grown over side walls and a bottom of the moat and then is selectively removed from the bottom of the moat to expose silicon. An epitaxial stalk (a recessed mesa) is grown on the silicon at the bottom of the moat to a height which makes its top at least coplanar with the top surface of the substrate.

4 Claims, 1 Drawing Sheet

SEMICONDUCTIVE STALK STRUCTURE

FIELD OF THE INVENTION

This invention relates to integrated circuit technology, and more particularly relates to a process for forming in a semiconductive chip a monocrystalline stalk (a recessed mesa) and to the product of such a process.

Cross-Reference Patent Application

This application is related to our copending U.S. patent application Ser. No. 07/319023 and now U.S. Pat. No. 4945769 entitled, "Semiconductive Structure Useful as a Pressure Sensor," which is being filed concurrently with this patent application and which has a common assignee.

BACKGROUND OF THE INVENTION

In the manufacture of integrated circuits, a plurality of circuit elements are formed in a monolithic semiconductive chip or structure and interconnected appropriately to provide a desired circuit function. In such integrated circuits, it is often necessary to electrically isolate individual circuit elements from one another. Various techniques are known for providing such isolation including PN junction isolation and dielectric isolation. In one form of dielectric isolation, one or more circuit elements to be isolated from other circuit elements are formed in a mesa that rises above the surrounding portion of the chip so that circuit elements in the top surface of the mesa are isolated both electrically and thermally in a lateral direction from the circuit elements at the top surface of the surrounding portion of the chip. Additionally, vertical isolation can be provided by including a high resistivity region in the mesa.

However, techniques of this kind that use mesas that rise above the plane of the top surface of the bulk of the chip have not found significant use in integrated circuits probably because of the disadvantages of either the need to form the mesas or the resulting non-planarity of the top surface.

For integrated circuit use, it is desirable to have a semiconductive chip or structure which has an essentially planar surface but in which exists one or more regions which provide the isolation of a mesa.

SUMMARY OF THE INVENTION

The present invention, in one aspect, provides a monocrystalline semiconductive structure that includes one or more mesa portions in which the mesas rise from a moat (cavity) in the structure so that the top surface of the mesa is essentially coplanar with the surrounding portion of the top surface of the structure. It will be convenient to designate such a recessed mesa that rises from a moat as a "stalk."

In another aspect, the present invention is directed to a process for forming such a stalk structure comprising the steps of: first forming on a main surface of a semiconductive body, typically silicon, at least one localized moat; oxidizing the walls of each moat; removing the oxide selectively from a limited portion of a bottom of each moat to expose the silicon surface there; and growing a vertical silicon stalk epitaxially selectively on the exposed silicon at the bottom of each moat to a height that provides a top surface essentially coplanar with the original main surface of the body. In some instances, it may be desirable to grow each stalk so that it extends slightly above the plane of the surrounding original material.

The invention will be better understood from the following more detailed description taken with the accompanying drawing.

Figure 1:
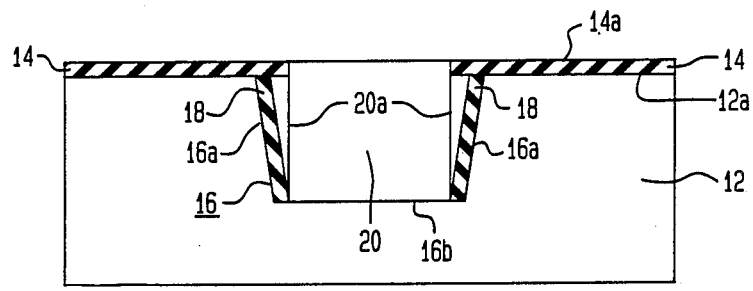
FIG. 1 shows in cross section a semiconductive structure that includes a vertical stalk in accordance with an illustrative embodiment of the invention.

It is to be noted that the drawing is not to scale and that back lines are omitted.

DETAILED DESCRIPTION

Referring now to FIG. 1, there is shown a semiconductive structure 10 in accordance with an embodiment of the invention. For simplicity, the structure 10 is shown including only a single stalk, although often a plurality of stalks would be fabricated simultaneously. Structure 10 is formed from a semiconductive body (substrate) 12 having a top (front) surface 12a which is covered by an apertured dielectric layer 14 (typically of silicon dioxide or silicon nitride). A moat 16, which extends through an aperture in the layer 14 and into the substrate 12, has side walls 16a and a bottom 16b. A dielectric layer 18 covers side walls 16a of moat 26. A stalk (or stalk structure) 20 extends essentially vertically from the bottom 16b of moat 16 through the aperture in the layer 14 and is essentially coplanar with a top surface 14a of layer 14. Stalk 20 has side walls 20a (typically essentially vertical) which contact layer 18 at or near bottom 16b and which are otherwise separated from layer 18. The stalk 20 may either be of uniform conductivity or may include one or more layers of different conductivity or conductivity types, depending on the end use desired. Typically, a lower region of the stalk 20 is of high resistivity so as to help electrically isolate an upper region of the stalk 20 from the body 12. Circuit elements (not shown) are typically formed at the top region of the stalk 20 and these may be interconnected with circuit elements (not shown) formed in the top surface 12a of the body 12.

The dimensions of the stalk 20 are chosen in the light of the function intended. A typical set of dimensions might comprise a height of 20 microns measured from the bottom of the moat 16 and a cross section about 20 microns square. To accommodate such a stalk 20, the moat 16 typically would be about 20 microns deep and have a cross section about 30 microns square at the top surface with side walls 16a tapered to a cross section of about 20 microns square at the bottom 16b of the moat 16. Other dimensions, both smaller and larger, are feasible.

For forming such a stalk structure 20, in accordance with an illustrative embodiment of the process aspect of the invention, there is first prepared a monocrystalline semiconductive wafer or body 12, typically of silicon, and large enough in lateral extent to include a plurality of stalk structure chips to be processed in parallel, and the body 12 would, after processing, be diced in the usual fashion into a plurality of such chips.

In one illustrative embodiment the semiconductive body 12 is 12 to 25 mils thick, is of p-type conductivity and has an impurity concentration of about $10^{15}$ impurities/cm$^3$. The stalk 20 is of n-type impurity, has an impurity concentration of about $10^{15}$ impurities/cm$^3$, is about 10 microns high and is about 110 microns square. In another embodiment stalk 20 has an impurity concentration of about $10^{18}$ impurities/cm$^3$ at a portion at and near the bottom 16b of moat 16 and has an impurity concentration of about $10^{15}$ impurities/cm$^3$ at and near the plane of top surface 14a of layer 14. This embodiment is useful for integrated injection logic (I$^2$l) devices.

Figure 2A:
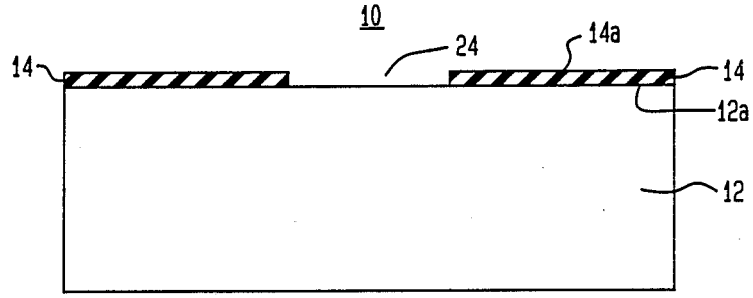
FIGS. 2A through 2D show in cross section the semiconductive structure of FIG. 1 in various stages of fabrication.

For purposes of discussion, there is shown in cross section in FIG. 2A a portion of a monocrystalline body 12 large enough to accommodate only a single stalk. Advantageously, the body 12 is cut so that the top surface 12a lies along a <100> plane of the crystal to promote subsequently preferential etching of the crystal along <111> crystal planes.

The top surface 12a of the body 12 is treated, typically by heating in an oxidizing ambient in the usual fashion, to form thereover an oxide layer 14 (predominantly silicon dioxide), illustratively about 1 micron thick. Layer 14 can be of silicon nitride or a combination of a layer of silicon dioxide and a layer of silicon nitride.

Then the oxide layer 14 is treated to form an opening (aperture) 24, for exposing the underlying silicon surface of body 12. Illustratively, the opening is about 20 microns square.

Figure 2B:
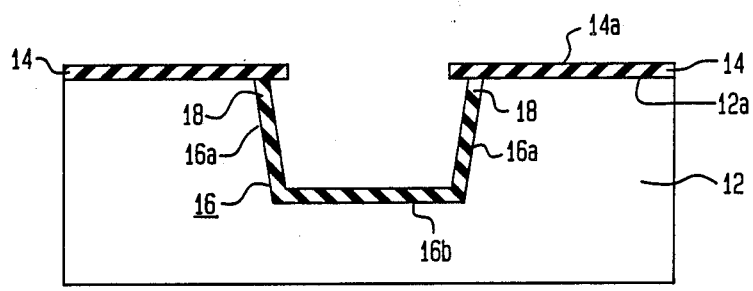

Then, as seen in FIG. 2B, the body 12 is etched to form a moat 16 having side walls 16a and a bottom 16b and extending about 20 microns into the body 12. The etch conditions are adjusted in known fashion to provide etching at a faster rate in the vertical or depth direction than the lateral directions so that limited undercutting of the oxide layer 14 occurs. The greater the undercutting, the greater the ultimate separation of the stalk to be formed from the side walls 16a of the moat 16. Illustratively, the body 12 is etched at atmospheric pressure and at 1200° C. in a reactor through which is flowed a gaseous mixture of 60 parts hydrochloric acid (HCL) to 80 parts hydrogen (H$_2$) to realize a vertical etching rate of about 10 microns per minute. As is known, control of the H$_2$-HCL ratio and temperature and pressure in such an etching system permits control of the ratio of vertical to lateral etching. Under the conditions described, the moat 16 at the top thereof, is about 30 microns square. The substrate 12 is then reheated in an oxidizing ambient to form a layer 18, typically predominantly largely silicon dioxide, having a thickness of about 1000 to 2000 Angstroms, over the side walls 16a and bottom 16b of the moat 16. Layer 18 can be of silicon nitride or a combination of a layer of silicon dioxide and silicon nitride.

Figure 2C:
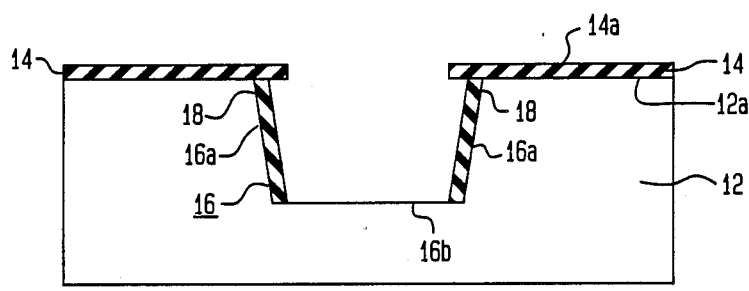

Then as shown in FIG. 2C, the oxide layer 18 is removed selectively from the bottom 16b of the moat 16, in known fashion, such as by anisotropic plasma etching to bare silicon at the bottom 16b of the moat 16 while little affecting the oxide layer 18 on the side walls 16a of the moat 16. Typically the plasma etching is done in a parallel plate etcher at about 700 watts with 30 SCCM of CHF$_3$, 120 SCCM of He and 90 SCCM of CF$_4$. Some thinning of the masking layer 14 is tolerable because of its larger initial thickness.

Then a vertical stalk 20 is formed in known fashion by a gaseous epitaxial deposition process that grows silicon selectively only over the bottom 16b of the moat 16 where the bare silicon is exposed. Illustrative growth conditions involve an ambient of silicon tetrachloride and hydrogen at 1200° C. and 1 atmosphere or dichlorosilane and hydrogen at a pressure of one atmosphere and a temperature of 1000° C. The growth is continued at least until the stalk 20 reaches a height such that its top surface 20a is essentially coplanar with the top surface 14a of the layer 14.

Figure 2D:
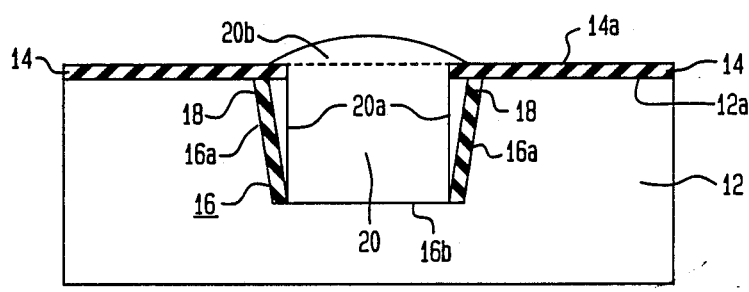

As shown in FIG. 2D, the stalk 20 is sufficiently tall that it passes through the opening in the masking layer 14 and forms a cap 20b that extends over the edge of the opening. As shown by the dashed line, such cap 20b can then be etched or polished away, if unwanted, to make the top surface of stalk 20 coplanar with the plane of the top of oxide layer 14 (as seen in FIG. 1). The stalk 20 could also be grown such that the top surface thereof is essentially in a common plane with surface 12a.

During the stalk 20 growth, using known techniques, appropriate impurities may be introduced into the gaseous ambient to impart desired conductivity properties. This technique permits PN junctions and conductivity gradients to be formed along the stalk 20 as desired. Additional PN junctions can be formed as desired in the stalk 20 after it has been fully grown in other fashions, such as by diffusion or implantation of appropriate donor or acceptor ions.

The resulting structure is, with the cap 20a removed, the same as semiconductive structure 10 of FIG. 1 with empty space existing between stalk 20 and side walls 16a of moat 16. In some instances, it may be preferable to fill such space with an appropriate dielectric, such as the spun-on glass which is used conventionally to coat the top of structure 10 to protect it from the ambient.

Various circuit elements may be formed in the stalk 20. Integrated injection logic (I$^2$L) devices are particularly well adapted for formation in the stalk 20 of structure 10. Other bipolar as well as field effect devices may also be formed within structure 10.

It should be understood that the specific embodiment described is merely illustrative of the general principles of the invention. Various changes may be made in the dimensions, materials and the processing parameters described without departing from the spirit and scope of the invention. Typically, the invention will be used to form a semiconductive structure in which each stalk is at least 1 micron square and 1 micron high and the top surface of the moat is at least 15 microns square. Moreover, it is usual to form in a single structure or chip a number of stalks of this kind. Still further, the semiconductive body 12 can be of n-type conductivity and the stalk 20 can be of p-type conductivity. Still further, the semiconductive body 12 and the stalk 20 can both be of n-type or p-type conductivity. Still further, the impurity concentration of the stalk 20 can be lower at a portion near the moat 16 than at the top or upper portions thereof. Still further, the impurity concentrations in different portions of the stalk 20 can be varied as desired.

The embodiments of the invention in which an exclusive property or privilege are defined as follows:

1. A monocrystalline semiconductive silicon structure that includes:

a monocrystalline silicon substrate having a first main surface;

a dielectric layer on said first main surface;

an opening in said dielectric layer;

a moat in said first main surface that extends substantially orthogonally into said monocrystalline silicon substrate from said opening in said dielectric layer in said first main surface, said moat having a bottom and side walls;

said moat side walls having integral oxidized surfaces extending from at least near the bottom of the moat up to said dielectric layer on said first main surface;

a monocrystalline semiconductive silicon stalk in said moat, said stalk having a base epitaxially disposed on said moat bottom and a top surface that is essentially coplanar with said first main surface; and a first circuit element formed in the top surface of said stalk, whereby said integral oxidized surfaces cooperate to provide an elongated resistive path between said first circuit element in the top surface of said stalk and a second circuit element formed at an adjacent site on said first main surface of the substrate.

2. The structure of claim 1 in which the dielectric layer on said first main surface of the silicon substrate is an oxidized portion of the silicon substrate.

3. The structure of claim 2 in which the oxidized portion of substrate's first main surface cooperates with said integral oxidized surfaces of the moat sidewalls, to form a substantially continuous integral silicon dioxide insulator surrounding said stalk.

4. The structure of claim 2 in which the monocrystalline silicon substrate has a plurality of said moats and monocrystalline silicon stalks, and each stalk has a height of at least 1 micron and dimensions parallel to said first main surface of at least 1 micron.

* * * * *